United States Patent [19]

Dalgleish et al.

[11] Patent Number: 5,933,349

[45] Date of Patent: *Aug. 3, 1999

[54] COMPONENT PLACEMENT

[75] Inventors: Alexander S. Dalgleish, Spring; Paul D. Tindall, Houston, both of Tex.

[73] Assignee: Compaq Computer Corporation, Houston, Tex.

[*] Notice: This patent issued on a continued prosecution application filed under 37 CFR 1.53(d), and is subject to the twenty year patent term provisions of 35 U.S.C. 154(a)(2).

[21] Appl. No.: 08/580,882

[22] Filed: Dec. 29, 1995

[51] Int. Cl.⁶ .................................................. G06F 19/00
[52] U.S. Cl. .................. 364/468.28; 29/832; 364/468.03
[58] Field of Search ............................ 29/740, 743, 834, 29/836, 832, 739; 53/443; 364/130, 488, 191, 491, 468.28, 468.03, 468.24, 468.21

[56] References Cited

U.S. PATENT DOCUMENTS

| | | |
|---|---|---|
| 4,706,187 | 11/1987 | Arai et al. ................................ 364/191 |
| 4,910,859 | 3/1990 | Holcomb . |
| 4,914,808 | 4/1990 | Okumura et al. ...................... 29/743 X |
| 5,040,291 | 8/1991 | Janisiewicz et al. . |
| 5,060,366 | 10/1991 | Asai et al. ............................. 29/836 X |
| 5,155,679 | 10/1992 | Jain et al. . |
| 5,212,881 | 5/1993 | Nishitsuka et al. ................... 29/836 X |
| 5,224,325 | 7/1993 | Takahashi et al. .................... 29/834 X |
| 5,384,956 | 1/1995 | Sakurai et al. ............................. 29/834 |
| 5,402,564 | 4/1995 | Tsukasaki et al. ........................ 29/832 |

FOREIGN PATENT DOCUMENTS

| | | | |
|---|---|---|---|
| 4053300 | 2/1992 | Japan | ...................... 29/834 |
| 4094598 | 3/1992 | Japan | ...................... 29/743 |
| 4162499 | 6/1992 | Japan | ...................... 29/743 |

*Primary Examiner*—William Grant
*Assistant Examiner*—Steven R. Garland
*Attorney, Agent, or Firm*—Conley, Rose & Tayon, P.C.; Michael F. Heim; Jonathan M. Harris

[57] ABSTRACT

The placement of components on a circuit board may be controlled automatically by creating a group containing two or more types of components to be placed on the circuit board and by developing a placement path by which any component within the group may be placed on the circuit board at any point along the placement path.

29 Claims, 10 Drawing Sheets

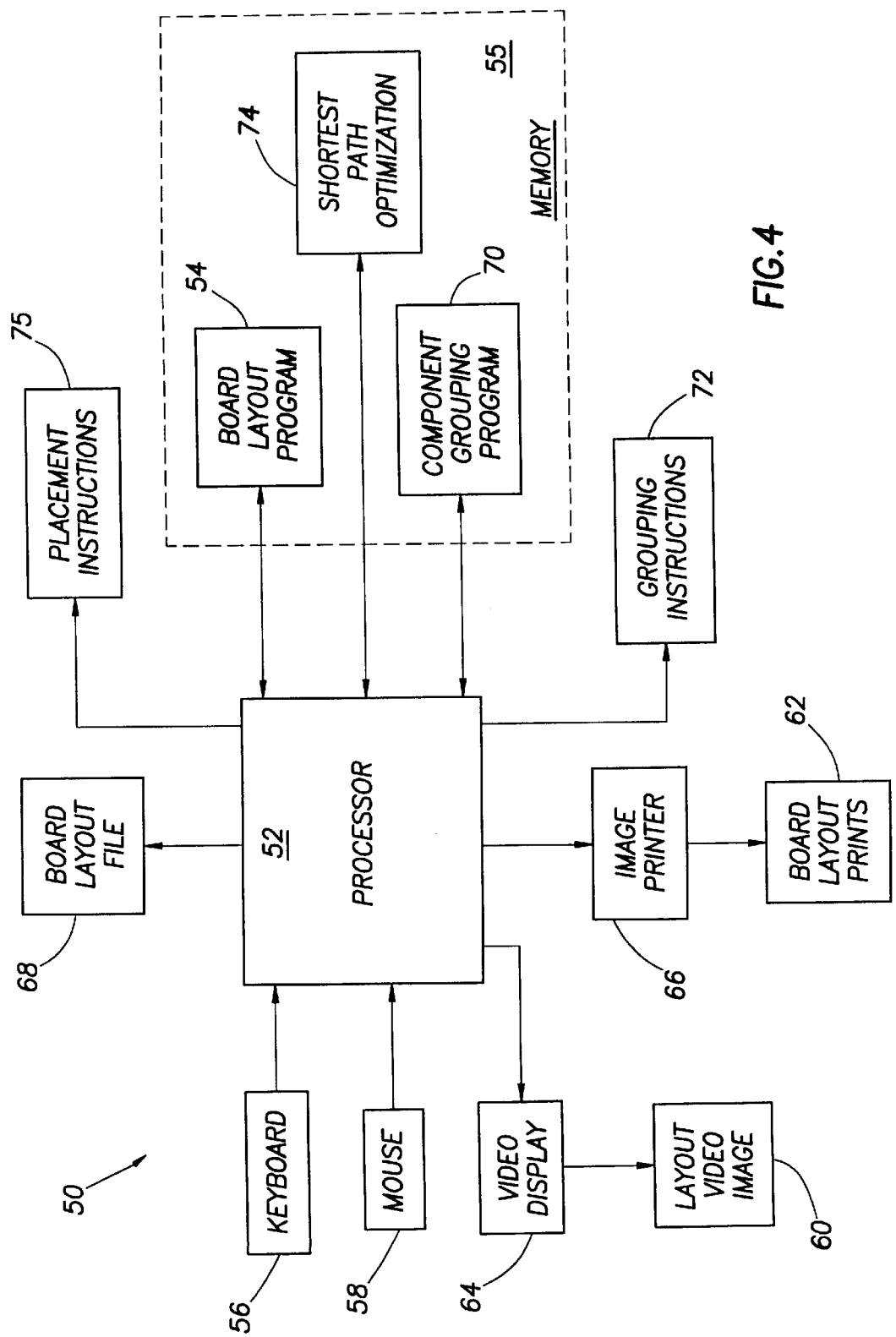

| COMPONENT | NUMBER |
|---|---|
| A | 27 |
| E | 25 |
| D | 12 |
| B | 9 |
| F | 9 |
| G | 7 |
| C | 2 |

FIG. 8

| COMPONENT | GRID # |  |  |  |  |  |  |  |  |  |  |  |  |  |  |  |  |  |  |  |  |  |  |  |  |
|---|---|---|---|---|---|---|---|---|---|---|---|---|---|---|---|---|---|---|---|---|---|---|---|---|---|
|  | 1-1 | 2-1 | 3-1 | 4-1 | 5-1 | 1-2 | 2-2 | 3-2 | 4-2 | 5-2 | 1-3 | 2-3 | 3-3 | 4-3 | 5-3 | 1-4 | 2-4 | 3-4 | 4-4 | 5-4 | 1-5 | 2-5 | 3-5 | 4-5 | 5-5 |
| A | 1 | 0 | 1 | 1 | 0 | 1 | 4 | 1 | 0 | 1 | 3 | 0 | 1 | 1 | 2 | 3 | 1 | 1 | 2 | 4 | 4 | 0 | 2 | 1 | 2 |
| E | 2 | 3 | 1 | 1 | 3 | 0 | 0 | 0 | 2 | 0 | 1 | 1 | 1 | 0 | 2 | 0 | 0 | 0 | 0 | 0 | 0 | 2 | 2 | 1 | 2 |
| D | 0 | 0 | 0 | 1 | 0 | 1 | 1 | 1 | 1 | 1 | 0 | 0 | 1 | 1 | 0 | 0 | 3 | 1 | 0 | 2 | 1 | 1 | 0 | 1 | 0 |
| B | 0 | 1 | 0 | 0 | 1 | 1 | 0 | 1 | 1 | 0 | 0 | 1 | 0 | 0 | 0 | 0 | 0 | 0 | 1 | 0 | 0 | 0 | 1 | 0 | 1 |
| F | 0 | 0 | 0 | 1 | 0 | 0 | 1 | 0 | 1 | 1 | 0 | 1 | 2 | 1 | 0 | 0 | 1 | 1 | 0 | 0 | 0 | 1 | 0 | 1 | 1 |
| G | 0 | 0 | 1 | 0 | 0 | 0 | 0 | 1 | 0 | 0 | 0 | 1 | 1 | 1 | 1 | 1 | 0 | 0 | 0 | 0 | 1 | 1 | 1 | 0 | 0 |
| C | 0 | 0 | 0 | 0 | 0 | 0 | 0 | 0 | 0 | 0 | 0 | 0 | 0 | 1 | 0 | 0 | 0 | 0 | 1 | 0 | 0 | 0 | 0 | 0 | 0 |

FIG. 10

| PAIR | COUNT | PAIR | COUNT |
|---|---|---|---|
| A-E | 9 | B-F | 4 |
| A-D | 7 | E-G | 4 |
| B-E | 7 | B-G | 3 |
| D-E | 7 | F-G | 3 |
| D-F | 7 | B-C | 2 |
| E-F | 7 | C-G | 2 |
| B-D | 6 | A-C | 1 |
| A-F | 5 | C-D | 1 |
| A-G | 5 | C-E | 1 |
| D-G | 5 | C-F | 1 |
| A-B | 4 |  |  |

FIG. 11

| GROUP | TOTAL # OF COMPONENTS |
|---|---|
| AED | 64 |
| BFG | 25 |
| C | 2 |

FIG. 14A

| SEQUENCE NUMBER | POSITION | TYPE | GROUP | SEQUENCE NUMBER | POSITION | TYPE | GROUP |
|---|---|---|---|---|---|---|---|
| 1 | 10, 10 | D | I | 17 | 40, 10 | D | I |
| 2 | 10, 20 | E | I | 18 | 35, 20 | B | II |
| 3 | 15, 25 | A | I | 19 | 20, 30 | F | II |
| 4 | 10, 40 | D | I | 20 | 15, 20 | G | II |
| 5 | 10, 50 | E | I | 21 | 10, 30 | G | II |
| 6 | 15, 45 | A | I | 22 | 50, 40 | B | II |
| 7 | 30, 50 | A | I | 23 | 40, 40 | F | II |
| 8 | 40, 45 | E | I | 24 | 25, 45 | B | II |
| 9 | 55, 50 | A | I | 25 | 60, 10 | F | II |
| 10 | 60, 40 | E | I | 26 | 65, 20 | G | II |
| 11 | 60, 30 | D | I | 27 | 25, 40 | C | SINGLE |
| 12 | 50, 20 | A | I | | | | |
| 13 | 45, 25 | E | I | | | | |
| 14 | 30, 35 | A | I | | | | |
| 15 | 25, 25 | E | I | | | | |
| 16 | 25, 10 | A | I | | | | |

COMPONENT PLACEMENT

BACKGROUND

The invention relates to component placement.

In general, one goal of electronic equipment manufacturers is to run production lines as quickly and efficiently as possible. To this end, manufacturers extensively use electronic automation to design and produce electronic assemblies. For example, printed circuit boards typically are assembled by "pick-and-place" machines that automatically select an electronic component for placement on a board, properly align the component and the board, and place the component on the board. These machines manufacture printed circuit boards much faster than human workers can.

Referring to FIG. 1A, one type of pick-and-place system often used in industry is a rotating turret-style system 20, such as the CP-series machines produced and sold by Fuji Manufacturing Company. In the turret-style system 20, a rotating turret 22 uses suction arms 24 to pick components 26 from a component table 28 and to place them on a circuit board 30 mounted onto an x,y-table 32. The turret 22 has several arms 24 so that it may pick one component from the component table 28 while it places another component onto the circuit board 30.

Referring also to FIG. 1B, the component table 28 holds reels 34 of tape 36 onto which the components 26 are mounted. When a turret arm 24 picks a component, the component table 28 rotates the reel 34 to expose the next component. The component table 28 moves in the x-direction so that after the system 20 has placed all of the components on one reel, the table 28 may move the next reel into position.

The x,y-table 32 properly positions the printed circuit board to receive components by moving the board in the x-, y-, and z-directions. In most situations, a complex optimization algorithm is used to attempt to minimize the x-, y-, and z-direction movement of the x,y-table 32 and the x-direction movement of the component table 28 while maximizing the rotational speed of the turret 22. Conventional optimization algorithms treat each component type as an individual entity, although most turret-style machines can pick components from any one of three adjacent component reels 34 without any significant reduction in placement speed. The turret 22, component table 28, and x,y-table 32 are controlled by one or more controllers 33 under the direction of a placement program generated by the optimization algorithm.

Referring to FIG. 2, a "shortest path optimization" algorithm is commonly used for component placement. The typical shortest path algorithm determines, for each type of component P, Q on a printed circuit board 38, the order in which the components should be placed to minimize the length of the placement path 40. The algorithm generally begins with the component type P that occurs most frequently on the board 38, then proceeds to the next most common component type Q. The shortest path calculation for the less common component type Q begins at the end 42 of the placement path 40 for the more common type P.

SUMMARY

In one aspect, the invention features automatically controlling the placement of components on a circuit board. A group containing two or more types of components to be placed on the circuit board is created, and a placement path by which any component within the group may be placed on the circuit board at any point along the placement path is developed.

Embodiments of the invention may include one or more of the following features. The group of components may be created by identifying two types of components that are to be closely situated at many locations on the circuit board and defining the group to contain components of the two types. The group also may be defined to include a third type of components that is to be closely situated to at least one of the other two types of components at several locations on the circuit board. Several areas may be defined on the circuit board, and the group may be defined to include types of components that appear together in a large number of areas. The group may include two types of components that appear together in more of the areas than any other two types of components. The areas may overlap each other, and each of the areas may be a block defined by a grid.

The placement path may be developed by calculating substantially the shortest path required to place all components in the group on the circuit board. An additional group may be created for every three types of components to be placed on the circuit board, and a placement path may be developed for each of the additional groups. The placement path for each additional group may begin where the placement path for a previous group ends. The components in each group may be placed on the circuit board according to the corresponding placement path.

In another aspect, the invention features a method of defining a sequence for placing components of multiple types in predefined locations on a circuit board. The components are organized into groups each containing at least two of the types of components. Components of a given one of the groups are placed on the circuit board, and thereafter components of another one of the groups are placed on the circuit board.

Embodiments of the invention may include one or more of the following features. All of the components of one group may be placed before any components of another group. The components of one group may be placed in an order such that any position in the order may be occupied by a component of any of the types contained in the group. The order in which the components of a group are placed may be determined by the shortest path required to place the components in the group. The types of components contained in each of the groups may be determined by the frequency with which components of different types appear in close proximity to each other. One group may contain the two types of components that most frequently appear in close proximity to each other. The group also may contain a third type of components. The components may be grouped based upon how frequently components of different types appear together within predefined placement areas. Each of the groups may contain three types of components.

In another aspect, the invention features a method of placing components of multiple types in accordance with a sequence defining an order in which the components are placed in predefined locations on a circuit board. In a subsequence of the sequence, multiple components which belong only to a first group of at least two of the types of components are placed. Likewise, components belonging to at least one additional group of at least two different types of components are placed.

In another aspect, the invention features a system for placing components on a circuit board. The system includes a placement machine configured to place the components according to groups containing at least two types of components and a controller that governs the operation of the placement machine such that components of a given one of the groups are placed on the circuit board and thereafter components of another one of the groups are placed.

Embodiments of the invention may include one or more of the following features. The placement machine may be a turret-style machine. The system also may include a component table that stores the components such that the components within each group occupy adjacent positions in the component table.

Advantages of the invention may include one or more of the following. Printed circuit board motion may be reduced during component placement, so the chances of jarring loose previously placed components may decrease. The time required to place components on a circuit board may be reduced by more than five percent, which provides greater production efficiency.

Other features and advantages of the invention will become apparent from the following description and from the claims.

DESCRIPTION

FIG. 4 is a block diagram of a computer system.

FIG. 8 is a table containing a list and count of components for each grid block in FIG. 7.

FIG. 10 is a table containing a grid count for the component pairs of FIG. 9.

FIG. 11 is a table containing a list of component groups.

FIG. 14A is a sequence listing for component placement.

Figure 3:
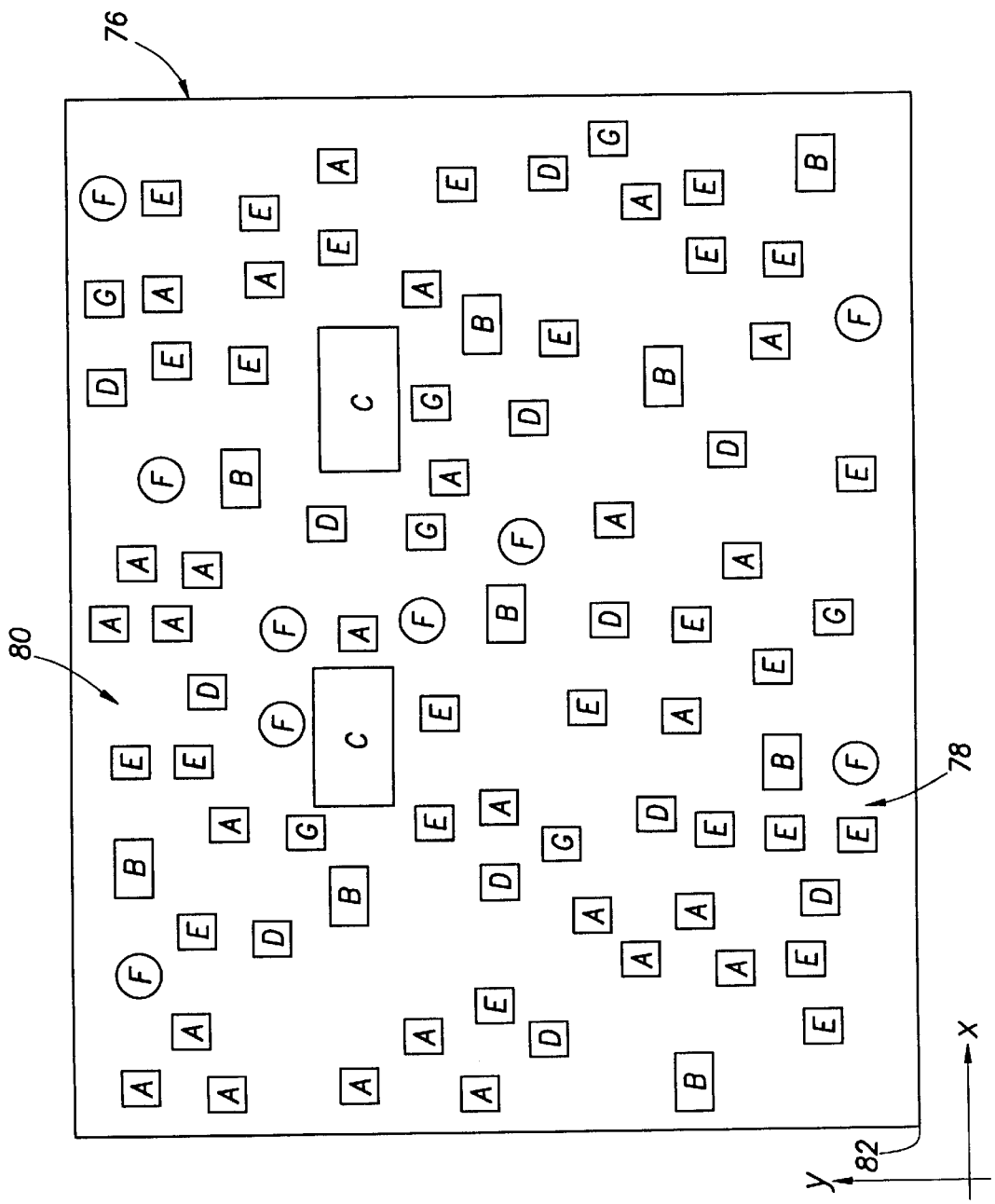

Referring to FIG. 3, a printed circuit board 76 may include many different types of components A, B, C, D, E, F, and G. The circuit board 76 may include electronic components, such as resistors, capacitors, inductors, processors, memory devices, and logic circuits, and it may include mechanical components, such as switches and connectors. Some component types (e.g., type A) appear frequently on the board 76, while others (e.g., type C) do not. Also, some areas of the board (e.g., area 78) are heavily populated with components, while other areas (e.g., area 80) are not.

Referring also to FIG. 4, a computer system 50 may be used to design a "layout" for the printed circuit board (i.e., a roadmap for placement of the components on the circuit board) and to organize the components into groups for "simultaneous" placement on the circuit board. To design the board layout, a computer processor 52 uses a board layout program 54 stored in memory 55. The layout program 54 typically is an interactive program that allows a user to provide information to the processor 52 through input devices, such as a keyboard 56 or a mouse 58. The processor may output information, such as a video image 60 or prints 62 of the layout, through output devices, such as a video display 64 or an image printer 66. The layout program 54 also generates a board layout file 68, which may be stored on any fixed or portable storage medium (neither shown). The board layout file 68 identifies each of the components included on the circuit board and the corresponding component type. The layout file 68 also identifies each component's exact location, as determined by the x,y-coordinate of its centroid with respect to a reference point (origin) on the circuit board, such as the board's lower left corner 82 (FIG. 3).

A component grouping program 70, also stored in memory 55, uses the information contained in the board layout file 68 to identify the types of components to be included on the circuit board and to determine the quantity and locations of each component type. Based on these determinations, the grouping program 70 organizes the components into groups for "simultaneous" placement and generates a set of grouping instructions 72. The grouping instructions treat all components in a group as a single component type.

Figure 1A:
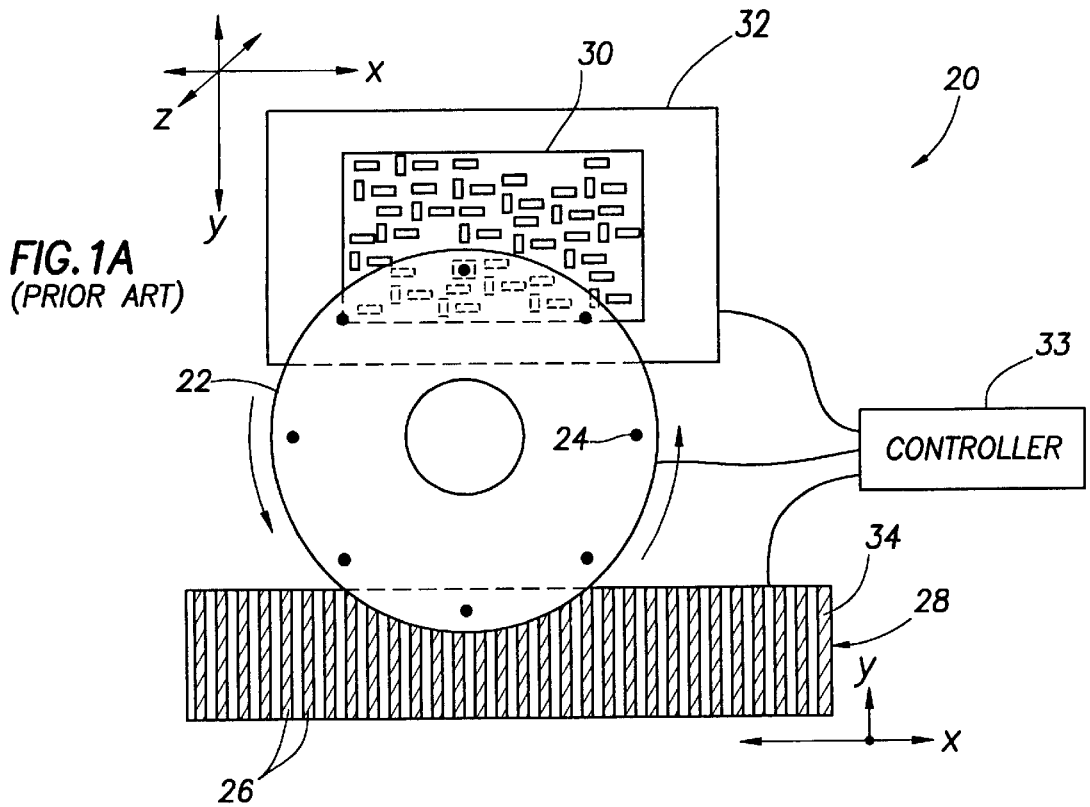
FIG. 1A is a top view of a component placement machine.
Figure 1B:
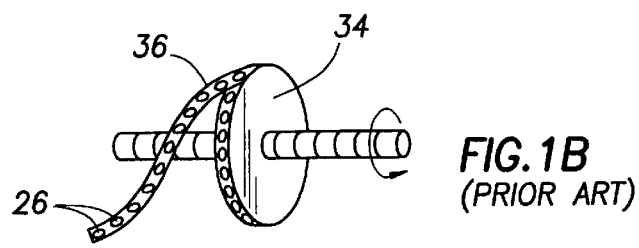
FIG. 1B is a perspective view of a component tape reel.
Figure 2:
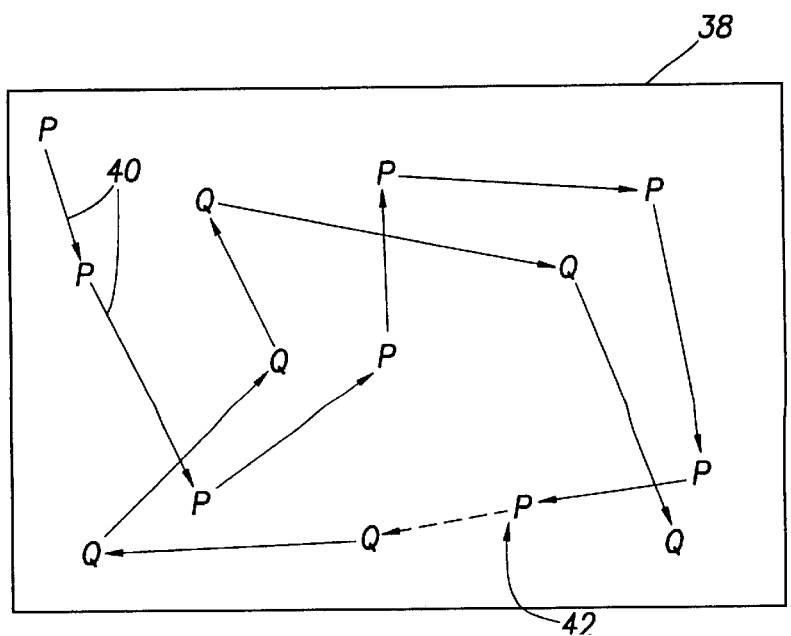
FIGS. 2 and 3 are top views of printed circuit boards.

A shortest path optimization program 74 in memory 55 uses the grouping instructions 72 to calculate the shortest placement path for each component group. Because the grouping program identifies all components in a group as a single component type, the optimization program calculates the shortest path for the group as a whole rather than for the individual component types that make up the group. The results of the shortest path optimization are stored in a placement instructions file 75, which is used, e.g., by the controller 33 of FIG. 1A to govern the placement of components on a circuit board.

Figures 5, 6:
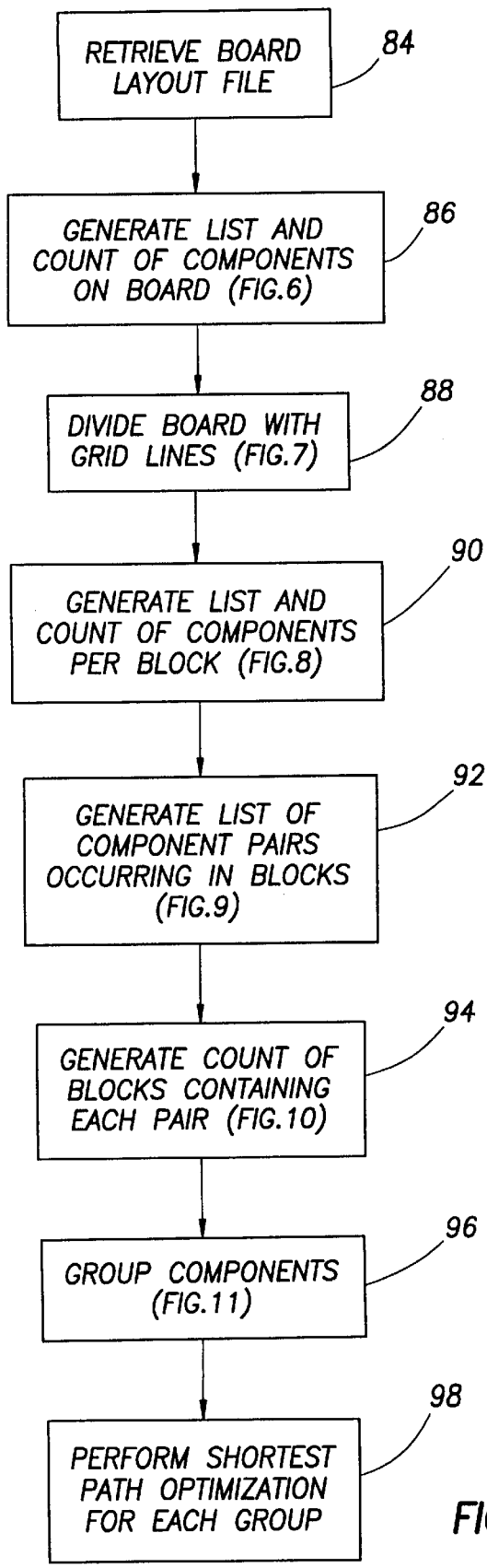
FIG. 5 is a flow diagram of a component grouping program.
FIG. 6 is a table containing a list and a count of components on a printed circuit board.

Referring to FIG. 5, the component grouping program begins by retrieving 84 the board layout file and parsing it to generate 86 a list of the types of components and a count of each type. FIG. 6 is a table containing a list and a count of component types for the circuit board of FIG. 3. Next, the program divides 88 the circuit board into a grid (FIG. 7) and generates 90 a list and a count of component types in each block of the grid (FIG. 8). The program then generates 92 a list of component pairs in each grid block (FIG. 9), which it uses to count 94 the number of grid blocks containing each of the component pairs (FIG. 10). The program then organizes 96 the component types into groups for "simultaneous" placement (FIG. 10) and calculates 98 the shortest placement path for the components in each group, as well as for each ungrouped (single) component type. A sample code for the grouping program is contained in the attached Appendix.

Figure 7:
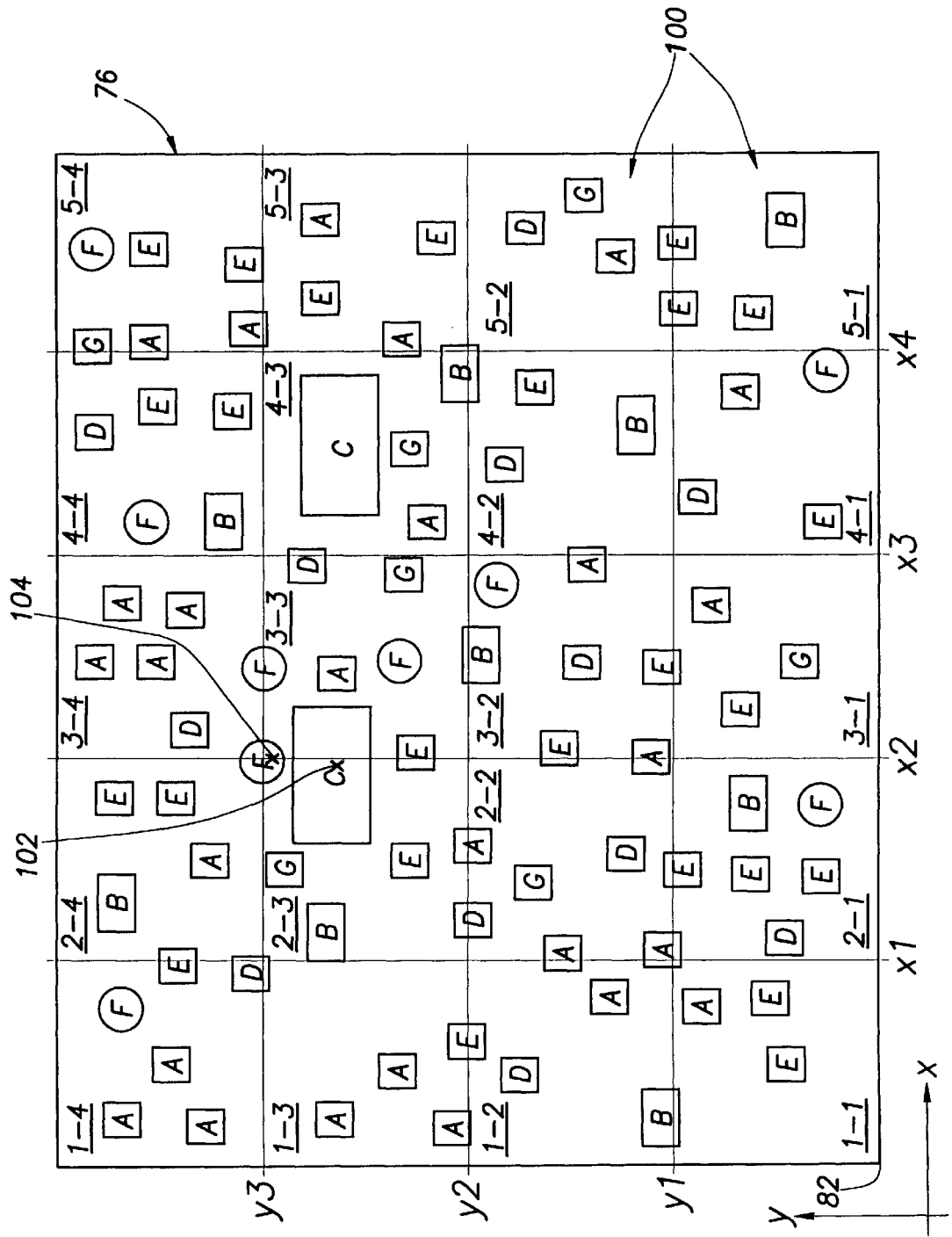
FIG. 7 is a top view of a printed circuit board divided into grid blocks.

Referring to FIG. 7, the grouping program uses information from the board layout file to determine the size of the circuit board 76 and to divide it into a grid. Grid lines X1, X2, X3, X4 and Y1, Y2, Y3 are created along the x- and y-axes, respectively, to divide the board 76 into equally-sized rectangular areas 100 ("grid blocks"). The lines are equally spaced, preferably by a distance of approximately twenty millimeters. Thus, a 10 cm×8 cm board 76 is divided into approximately twenty grid blocks 100 (5×4).

Referring also to FIG. 8, the grouping program determines which types of components A-G fall into the various grid blocks 100 and counts how many components of each type A-G appear in each block. To do so, the program performs a "less-than-or-equal-to" comparison of the x,y-coordinate for each component's centroid (not shown) to the x-coordinate or y-coordinate of the grid lines X1, X2, X3, X4, and Y1, Y2, Y3, respectively. Thus, a component whose centroid has an x-coordinate less than or equal to the x-value of line X1 and a y-coordinate less than or equal to the y-value of line Y1 falls into grid block 1-1. Likewise, a component whose centroid has a an x-value greater than that of X4 and a y-value greater than that of Y3 falls into grid block 5-4. Because the program performs a "less-than-or-equal-to function," a component whose centroid lies on a grid line falls into the leftmost or lower grid block.

As an example, consider grid block 2-3, which entirely contains one type B component, one type E component, and one type G component, but only partially contains a second type E component and components of types A, C, D, and F. Because the centroid 102 of the type C component clearly lies within grid block 2-3, the grouping program lists the type C component as a member of that block. The same is true for the type D component. The location of the type F component, which partially lies in four grid blocks (2-3, 3-3, 2-4, 3-4), is not as clear. But because the centroid 104 of the type F component lies on line X2 and below line Y3, it also falls within block 2-3. The centroids (not shown) of the type A component and the second type E component are outside grid block 2-3, so the program does not list these components as members of block 2-3. Therefore, grid block 2-3 contains one component of every type except type A.

Figure 9:
FIG. 9 is a chart containing a list of component pairs for each grid block of FIG. 7.

Referring also to FIG. 9, after the grouping program lists and counts the components in the various grid blocks 100, it determines and lists the component pairs appearing in each block. For example, grid block 1-1 contains one type A component and two type E components, so the program lists component pair A-E as the only pair in block 1-1. Because block 2-3 contains every component type except type A, the program lists for this block all component pairs that exclude type A.

Referring to FIG. 10, the grouping program then lists each component pair 106 that appears on the board and a count 108 of grid blocks in which each pair appears. The component pair that appears most often (A-E, nine blocks) tops the list, while the component pair that occurs least often (A-C, C-D, C-E, C-F, 1 time each) is listed last.

Referring also to FIG. 11, the grouping program uses the list of component pairs (FIG. 10) to organize the components into groups 110 of three component types. The program creates the first component group 112 by selecting the two component types A, E that make up the pair which occurs most often (A-E). If two or more component pairs appear the same number of times but more than any other pairs, the program selects the pair that includes the highest total number of components on the board. For example, if pairs A-E and A-D had appeared in the same number of grid blocks (FIG. 10), the program would select pair A-E because the board contains 52 components of type A and type E, which is more than the 39 type A and type D components (FIG. 6).

The program then rounds out the first component group 112 by selecting the component that most frequently occurs with one of the two previously selected component types A, E. Because component types B, D, and F occur equally frequently with one of the selected components A, E (FIG. 10), the program must select the third component using one four possible tie-breaking methods. First, the program may select the component type that occurs most often on the circuit board (FIG. 6). Second, if the program must choose between two components that are paired with the same component from the first pair, the program may choose the component that occurs most frequently with the other component from the first pair. Thus, if the first pair chosen is pair A-E and pairs A-B and A-D are the remaining pairs that occur most often, then the program may choose the component type (B or D) that occurs most often with type E components. Third, if the program must choose between two components each paired with a different member of the first pair, the program may choose the component paired with the most frequently occurring member of the first pair. Thus, if the first pair chosen is pair A-E and the program must choose between pair A-D and pair E-F, the program may determine which of component types A and E occurs most frequently and select the corresponding component type D or F, respectively. Fourth, the program simply may select the component appearing in the pair that occurs first in the list.

If the program uses the first approach to select the third component, it selects component type D since the board contains more type D components than any other remaining type (FIG. 6). The first component group 112 thus includes type A, type D, and type E components.

After the first component group 112 is complete, the program strikes all component pairs containing any of the three selected component types A, D, E and repeats the process on the remaining pairs (B-F, F-G, B-C, C-G, C-F) until fewer than three component types remain. Any ungrouped components ("singles") are treated individually. For the circuit board 76 of FIG. 3, the second component group 114 includes type B, type F, and type G components. Type C components are ungrouped and thus are treated as a single 116.

The grouping program also may generate for each group a count of the total number of components 118 appearing on the board. The first component group 112 (types A, D, E) includes sixty-four of the ninety-one components on the board, the second component group 114 (types B, F, G) contains twenty-five components, and the single 116 (type C) contains two components.

Figure 12:
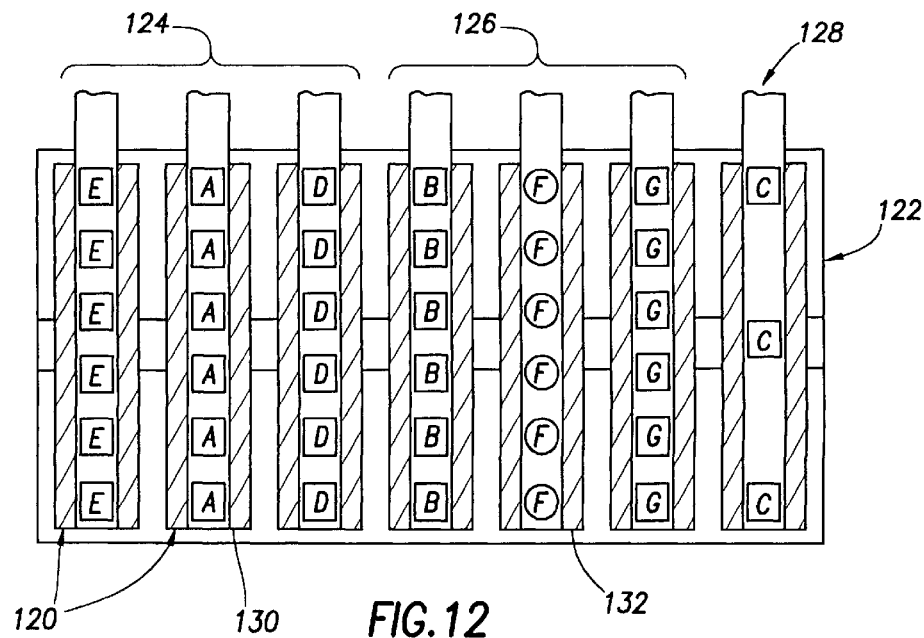
FIG. 12 is a top view of component reels grouped in a component table.

Referring to FIG. 12, once the component types have been grouped, the component reels 120 corresponding to each group are placed side-by-side into a component table 122. The reels 124 holding the first group of components (types A, D, E) are first placed into the table, followed by the reels 126 of the second group (types B, F, G) and the reel 128 containing the single components (type C). Within each group, the reel containing the most frequently occurring components is placed between the other two components in the group. Therefore, the type A reel 130 and the type F reel 132 are the center reels in the first group 124 and the second group 126, respectively.

Figure 13:
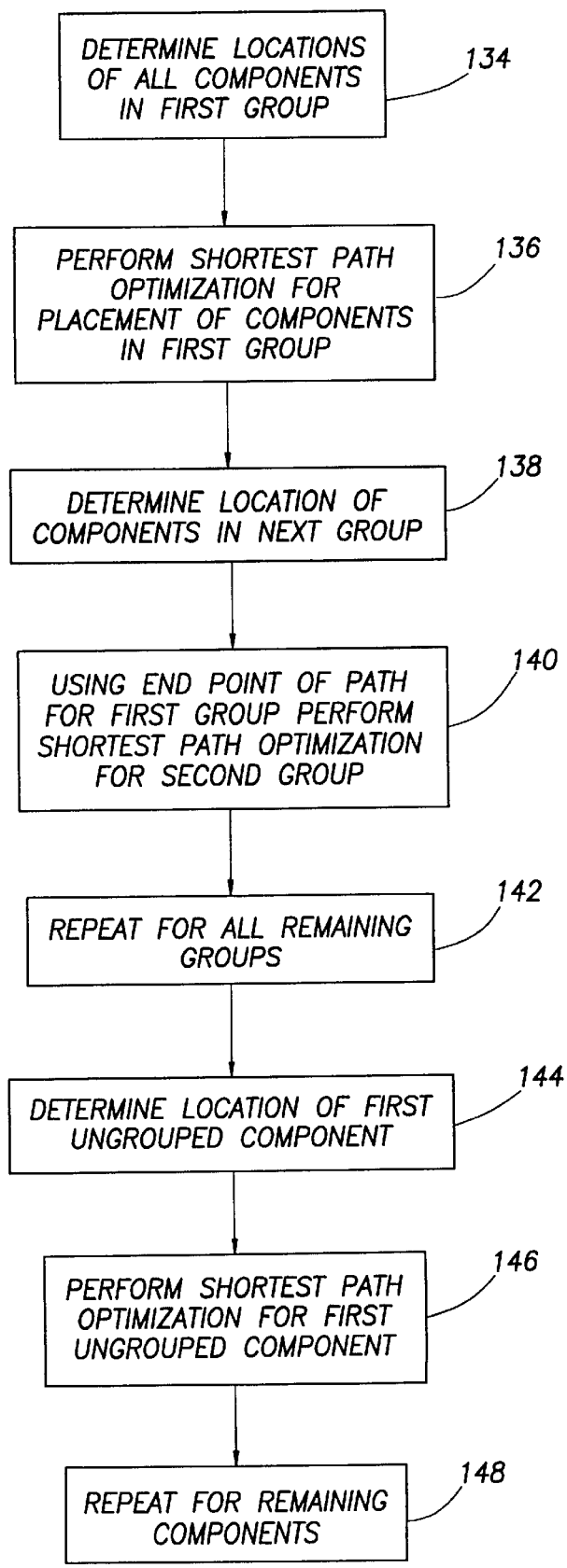
FIG. 13 is a flow chart for a shortest path optimization routine.

Referring to FIG. 13, a shortest path optimization program uses the grouping instructions (FIG. 4) created by the grouping program to calculate the shortest placement path for each component group. The optimization program first determines 134 the locations of all components in the first group (which the grouping instructions treat as a single entity) and calculates 136 the shortest path for placement of these components. The program then determines 138 the locations of the components in the second group and the step 140 calculates the shortest placement path for the second component group. The optimization program then repeats 142 the shortest path calculation for all remaining component groups. When the program reaches the first single component type, step 144 determines the locations of all components of this type and calculates 146 the shortest path for placement of these components. The program repeats 148 this process until no components remain.

Figure 14B:
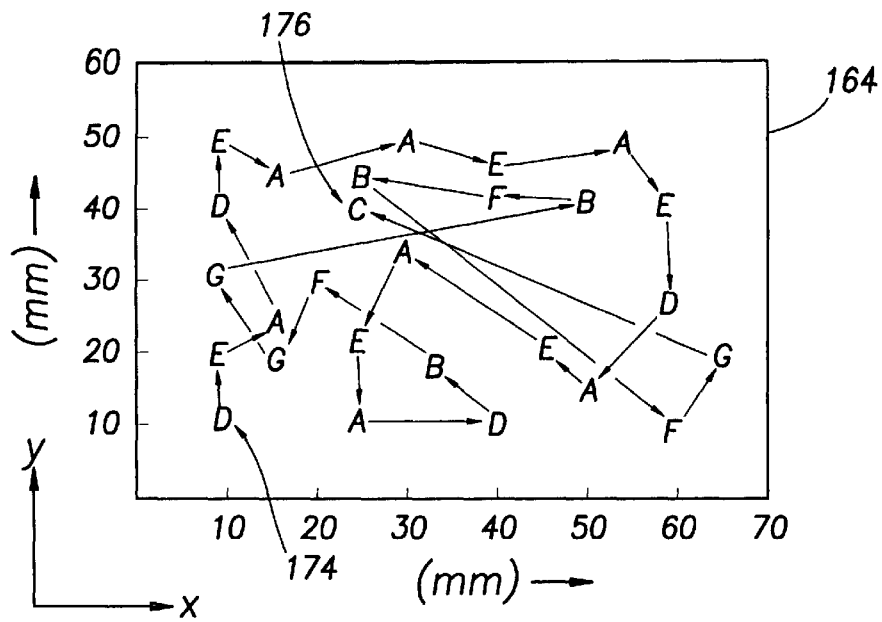
FIG. 14B is a circuit board with components placed according to the sequence of FIG. 14A.

Referring to FIGS. 14A and 14B, the shortest path optimization program generates a sequence listing 162 that determines the order in which components are placed on a circuit board 164. The sequence listing 162 identifies each component to be placed on the board by its number 166 in the placement sequence, its position 168 on the board 164, its type 170, and the group 172 into which the component falls. For example, the first component 174 to be placed on the board 164 is a type-D component at x=10 mm, y=10 mm, and the last component 176 to be placed is a type-C component at x=25 mm, y=40 mm. The arrows between components in FIG. 14B show the placement path associated with the sequence listing 162.

Within the sequence listing 162 are subsequences 178, 180 that guide the placement of components within the component groups. In the first subsequence 178, all Group I components (type A, D, and E components) are placed on the board 164, and in the second subsequence 180, all Group II components (type B, F, and G components) are placed. As the sequence listing 162 shows, the first subsequence 178 is completed before the second subsequence 180 begins. After all grouped components are placed, the single components 176 (type C components) are placed.

Alternatively, once the shortest placement path has been calculated for each component group, the end points of the placement paths may be matched up to determine the order in which the groups are placed. For example, in FIGS. 14A and 14B, the (40,10) endpoint of Group I is closest to the (35,20) endpoint of Group II. Likewise, the (10,10) endpoint of Group I is closest to the (25,40) endpoint of the single component. Therefore, the components likely would be placed in the following order: Single, Group I, Group II. In this situation, the type C component would be placed first in the sequence, the Group I components would be placed at positions 2 through 18 in the sequence, and the Group II components would be placed at positions 19 through 27 in the sequence. When endpoint matching is used, the placement order of components within a group may be inverted to allow the endpoints of the group's placement path to match up with the endpoints of adjacent groups.

The grouping program and the shortest path optimization algorithm also may be used in systems having multiple placement machines. In these systems, large component groups may be divided among several placement machines to balance the cycle time of each machine.

Figure 15:
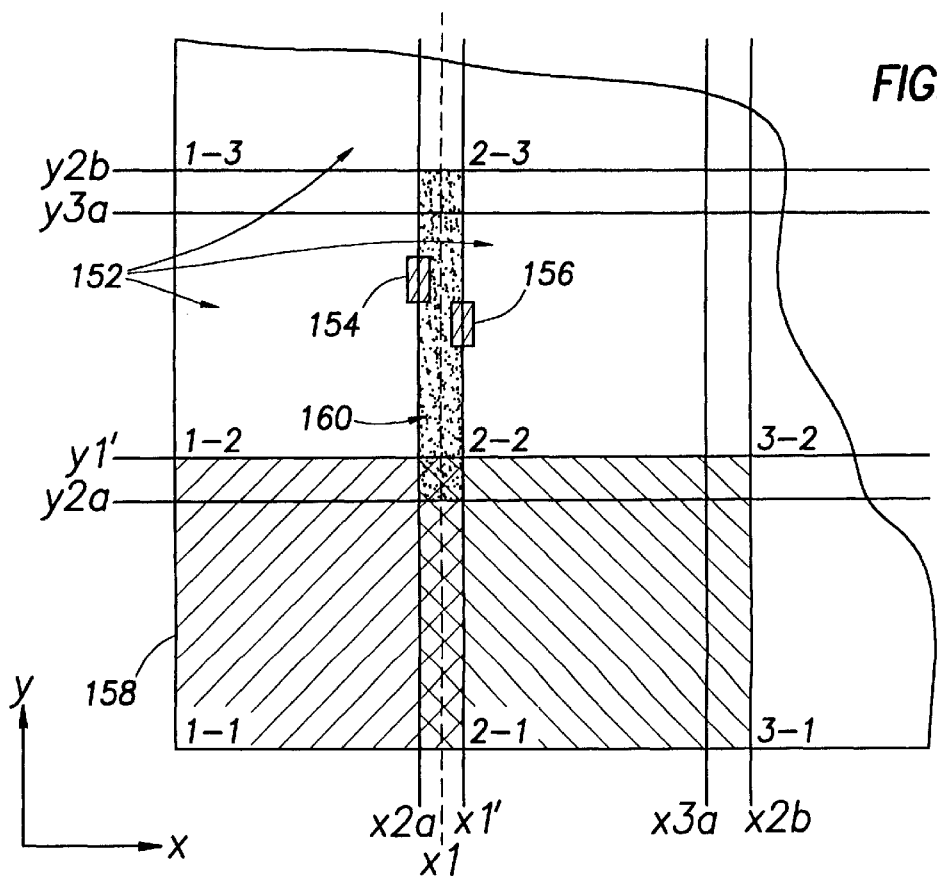
FIG. 15 is a partial top view of a printed circuit board divided into overlapping grid blocks.

Referring to FIG. 15, in an alternative embodiment, the grouping program improves component grouping by ensuring that closely situated components always are counted as a component pair. In the grid of FIG. 7, components 154 and 156 would not be counted as a pair, even though they are of different types and are closely situated, because they lie on opposite sides of grid line X1 and therefore do not fall into the same grid block. With an overlapping grid, however, the components, if situated closely enough, are certain to fall within same grid block.

Grid block 1-2 is defined along the x-axis by the left edge 158 of the circuit board 150 and by grid line X1' and is defined along the y-axis by grid lines Y2a and Y2b. The location of grid line X1' is offset a small distance beyond the location of the original grid line X1, preferably about two millimeters. Grid block 2-2 is defined along the x-axis by grid lines X2a and X2b and along the y-axis by grid lines Y2a and Y2b. The location of grid line X2b is offset approximately two millimeters to the left of the location of the original grid line X1. Therefore, grid blocks 1-2 and 2-2 overlap by distance of approximately four millimeters, enough to allow at least one of the components 154, 156 to fall into both grid blocks, which ensures that the components 154, 156 are treated as a pair.

If both components 154, 156 lie within the overlap region 160, the components 154, 156 will be treated as a pair in both block 1-2 and block 2-2. To prevent the components 154, 156 from contributing twice to the pair's grid count, the grouping program must analyze the overlapping grid blocks 1-2 and 2-2 for additional occurrences of the pair formed by components 154 and 156. If either block 1-2 or block 2-2 contains an additional occurrence of the pair, or if both blocks do, the presence of the pair in the overlap region 160 will not affect the grid count. But if neither block 1-2 nor block 2-2 contains an additional occurrence of the pair, the grouping program must subtract one from the grid count.

Other embodiments are within the scope of the following claims. For example, component groups may contain two, instead of three, component types. For component placement machines that are able to pick from four or more adjacent components without a reduction in performance, the component groups may include four or more component types. In addition, optimization algorithms other than the shortest path algorithm may be used.

The following sample PERL code is from a file with the name SEPERATE.BAT:

```
@rem = '
@echo off
perl -S %0.bat %1 %2 %3 %4 %5 %6 %7 %8 %9
goto endofperl
';
sub max {
    local($a,$b) = @_;
    $ret = $a > $b ? $a : $b;
    $ret;
}
sub min {
    local($a,$b) = @_;
    $ret = $a < $b ? $a : $b;
    $ret;
}
sub abs {
    local($a) = @_;
    $ret = sqrt($a*$a);
    $ret
}
#----------------------------------------------------------------------
# START OF PROGRAM
#----------------------------------------------------------------------
($infile,$outfile,$x_grid,$y_grid,$pn_per_group,$cell_count) =
@ARGV;
open(IN,$infile) || die "Could not open $infile for input\n";
open(OUT,">$outfile") || die "Could not open $outfile for output\n";
$min_y = 5000;
$min_x = 5000;
# read input file
printf STDERR "Reading input file . . .";
while ($line=<IN>) {
    chop($line);
    if ($line =~
        m/([-]?\d*\.\d*)\s+([-]?\d*\.\d*)\s+(\d+-\d+)/) {
        push(@x_coord,$1);
        push(@y_coord,$2);
        push(@pn_seq,$3);
        $pn_qty{$3}++;
        $part_qty++;
        $min_y = &min($min_y,$2);
        $min_x = &min($min_x,$1);
    }
}
printf STDERR "Done ($part_qty parts)\n\n";
```

```
printf OUT "Part Number Distribution:\n";
printf STDERR "Part Number Distribution:\n";
foreach $key (sort {$pn_qty{$b} <=> $pn_qty{$a}} keys(%pn_qty)) {
    printf OUT "\t$key\t$pn_qty{$key}\n";
    printf STDERR "\t$key\t$pn_qty{$key}\n";
}
printf OUT "Part Count: $part_qty\n";
printf STDERR "Part Count: $part_qty\n";
# Create the grids and part number counts per grid
printf STDERR "Creating grids . . .";
foreach $i (0 . . . $#x_coord) {
    if ($pn_qty{$pn_seq[$i]} > 1) {
        $band_x = int(&abs(($x_coord[$i] - $min_x)/$x_grid)) + 1;
        $band_y = int(&abs(($y_coord[$i] - $min_y)/$y_grid)) + 1;
        $part_matrix{"$band_x.$band_y.$pn_seq[$i]"}++;
    }
    else
    {
        push(@singles,$pn_seq[$i]);
    }
}
foreach $key (sort keys %part_matrix) {
    @foo = split(/\./,$key);
    push(@lines,"$foo[0]\t$foo[1]\t$foo[2]\t$part_matrix{$key}");
}
foreach $i (0 . . . $#lines) (
    $line = $lines[$i];
    if ($line =~ m/(\d+)\s+(\d+)\s+(\d+-\d+)\s+(\d+)/) {
        $row = $1; $col $2; $pn = $3; $qty = $4;
        $parts{"$row.$col"} .= "$pn;";
    }
}
printf STDERR "Done\n\n";
undef @lines;
# Create the part pairs list
printf STDERR "Forming groups . . .\n";
foreach $grid (sort keys(%parts)) {
    undef %foo;
    foreach (split(/;/,$parts{$grid})) { $foo{$_}++; }
    under @bar; $ib = 0; $bar[$ib] = "";
    foreach (sort keys(%foo)) { $bar[$ib++] = $_;}
    foreach $i (0 . . . ($#bar-1)) {
        foreach $j (($i+1) . . . $#bar) {
            $pair = "$bar[$i].$bar[$j]";
            $pairs{$pair}++;
        }
    }
}
printf OUT "Part Number Pairs: ($x_grid mm X $y_grid
mm grid size)\n";
printf STDERR "Part Number Pairs: ($x_grid
mm X $y_grid mm grid size)\n"
;
foreach $key (sort {$pairs{$b} <=> $pairs{$a}} keys(%pairs)) {
    push(@lines, "$key\t$pairs{$key}\n")
    printf OUT "\t$key\t$pairs{$key}\n";
    printf STDERR "\t$key\t$pairs{$key}\n";
}
# Create the part groups
printf OUT
"Part Groupings: (Maximum part numbers per group is
$pn_per_group)\n";
printf STDERR
"Part Groupings: (Maximum part numbers per group is
$pn_per_group)\n";
$lines[0] =~ m/(\d+-\d+)\.(\d+-\d+)\s+(\d+)/;
$pn1 = $1; $pn2 = $2; $pair_count = 3;
push(@group, "$pn1;$pn2;")
push(@group_count,2);
foreach $i (1 . . . $#lines) {
    $line = $lines[$i];
    if ($line =~ m/(\d+-\d+)\.(\d+-\d+)\s+(\d+)/ {
        $pn1 = $1; $pn2 = $2; $pair_count = $3;
        $found1 = 0; $found2 = 0;
        foreach $j (0 . . . $#group) {
            if (index($group[$j],$pn1) >= 0) {$found1 = 1; $i1 = $j; }
            if (index($group[$j],$pn2) >= 0) {$found2 = 1; $i2 = $j; }
            last if (($found1 == 1) && ($found2 == 1));
        }
        if (($found1==0) && ($found2==0)) {
            push(@group, "$pn1; $pn2;"); push(@group_count,2);
        }
        elsif ($foundl && $found2) { }
        else {
            if (($found2 && ~$found1 && ($group_count[$i2] >=
$pn_per_group))) {
                push(@group, "$pn1;"); push(@group_count,1);
            }
            elsif (($found2 && ~$found1 && ($group_count[$i2] <
$pn_per_group))) {
                $group[$i2] .= "$pnl;"; $group_count[$i2]++;
            }
            elsif (($found1 && ~$found2 && ($groupcount[$i1]
>=$pn_per_group))) {
                push(@group, "$pn2;"); push(@group_count,1);
            }
            elsif (($found1 && ~$found2 && ($group_count[$i1] <
$pn_per_group))) {
                $group[$i1] .= "$pn2;"; $group_count[$i1]++;
            }
        }
    }
}
foreach $i (0 . . . $#singles) {
    $grouped{'S'} .= "$singles[$i];";
}
$grouped_count{'S'} = $#singles+1;
$grouped{'S'} = "S\t#singles\t$grouped{'S'}";
$seq = 1;
foreach $i (0 . . . $#group) {
    @foo = split(/;/,$group[$i]);
    $sum = 0;
    foreach $j (0 . . . $#foo) {
        $sum += $pn_qty{$foo[$j]};
    }
    if ($group_count[$i] > 1) {
        $grouped{$seq} = "$seq\t$sum\t$group[$i]";
        $grouped_count{$seq} = $sum;
        $seq++;
    }
}
foreach $key (sort {$grouped_count{$b} <=> $grouped_count{$a}}
keys(%grouped_count)) {
    printf OUT "\t$grouped{$key}\n";
    printf STDERR "\t$grouped{$key}\n";
}
printf OUT "Parts#not grouped:\n";
printf STDERR "Parts not grouped:\n";
$seq = 1;
foreach $key (sort {$pn_qty{$b} <=> $pn_qty{$a}} keys(%pn_qty)) {
    $found = 0;
    foreach $key_1 (keys(%grouped)) {
        if (index($grouped{$key_1},$key) >= 0) { $found=1; }
        last if $found;
    }
    if ($found == 0) {
        if ($pn_qty{$key} > 1) {
            $ungrouped{$key} = "$key\t$pn_qty{$key}";
            $ungrouped_count{$key} = $pn_qty{$key};
            $seq++;
        }
    }
}
foreach $key (sort {$ungrouped_count{$b} <=>
$ungrouped_count{$a}}
keys(%ungrouped count).) {
    printf OUT "\t$ungrouped {$ key }\n";
    printf STDERR "\t$ungrouped{$key}\n";
}
$part_per_cell = int($part_qty/$cell_count)+1;
foreach $key (sort {$grouped_count{$b} <=> $grouped_count{$a}}
keys(%grouped_count)) {
    $allocated = 0;
    foreach $i (1 . . . $cell count) {
        if (($cell[$i] + $grouped_count{$key}) <= $part_per_cell) {
            $allocated = 1;
            $cell_parts[$i] .= "$key;";
            $cell[$i] += $grouped_count{$key};
            last if ($allocated == 1);
```

-continued

```
    }
    if ($allocated ==0) {
        $min_cell = 1;
        foreach $j (2 . . . $cell_count) {
            $min_cell = ($cell[$min_cell] < $cell[$j]) ?
                $min_cell : $j ;
        }
        $cell_parts[$min_cell] .= "$key;";
        $cell[$min_cell] += $grouped_count{$key};
    }
}
foreach $key (sort {$ungrouped_count{$b} <=>
$ungrouped_count{$a}}
keys(%ungrouped_count)) {
    $allocated = 0;
    foreach $i (1 . . . $cell_count) {
        if (($cell[$i] + $ungrouped_count{$key}) <= $part_per_cell) {
            $allocated = 1;
            $cell_parts[$i] .= "$key;";
            $cell[$i] += $ungrouped_count{$key};
        }
        last if ($allocated == 1);
    }
    if ($allocated ==0) {
        $min_cell = 1;
        foreach $j (2 . .. $cell_count) {
            $min_cell = ($cell[$min_cell] < $cell[$j]) ?
                $min_cell : $j ;
        }
        $cell_parts[$min_cell] .= "$key;";
        $cell[$min_cell] += $ungrouped_count{$key};
    }
}
printf OUT "Separation:\n";
printf STDERR "Separation:\n";
foreach $i (1 . . $cell_count) {
    printf OUT "\t$i\t$cell[$i]\t$cell_parts[$i]\n";
    printf STDERR "\t$i\t$cell[$i]\t$cell_parts[$i]\n";
}
__END__
:endofperl
```

What is claimed is:

1. A method for developing a placement path along which components taken from respective component supplies will be placed on a circuit board, the method comprising:

for each location at which a component will be placed, identifying the component supply from which the component will be taken;

for at least one selected component supply, determining which, if any, of the other component supplies are identified with locations lying within a predetermined proximity of a location identified with the selected component supply; and developing the placement path based on the proximity determinations.

2. The method of claim 1 further comprising:

for each component supply, determining a relative frequency at which locations identified with the component supply lie within a predetermined proximity of locations identified with each of the other component supplies; and developing the placement path based on the relative frequency determinations.

3. The method of claim 2 further comprising:

identifying two component supplies that are associated with a given relative frequency.

4. The method of claim 3 wherein the placement path is developed so that all of the locations with which the two component supplies are identified will lie at consecutive positions along the placement path.

5. The method of claim 3 further comprising:

identifying a third component supply that, in combination with one of the two component supplies, is associated with another given relative frequency.

6. The method of claim 5 wherein the placement path is developed so that all of the locations with which the three component supplies are identified will lie at consecutive positions along the placement path.

7. The method of claim 1 wherein the placement path is developed so that all of the locations with which at least two of the component supplies are identified will lie at consecutive positions along the placement path.

8. The method of claim 1 wherein the placement path is developed so that all of the locations with which three of the component supplies are identified will lie at consecutive positions along the placement path.

9. The method of claim 1 wherein two locations lie within the predetermined proximity only if both locations lie within a given section of the circuit board.

10. A method for developing a placement path along which components taken from respective component supplies will be placed on a circuit board having at least two sections, the method comprising:

for each location at which a component will be placed, identifying the component supply from which the component will be taken;

for each section of the circuit board, identifying which, if any, of the component supplies are identified with one of the locations in the section;

for each possible pair of the component supplies, establishing a count of how many sections, if any, are identified with both of the component supplies in the pair;

identifying, from all possible pairs of component supplies, a first pair for which the highest count is established; and developing the placement path so that all of the locations identified with the first pair of component supplies belong to a set of locations that will lie at consecutive positions along the placement path.

11. The method of claim 10 wherein none of the sections overlap.

12. The method of claim 10 wherein at least some of the sections overlap.

13. The method of claim 10 further comprising:

identifying, from all other possible pairs of component supplies that include one of the component supplies in the first pair, a second pair of component supplies, wherein the second pair has a highest count of the counts established for the other possible pairs of component supplies that include one of the component supplies in the first pair.

14. The method of claim 13 wherein the placement path is developed so that all locations identified with the component supplies of the first and second pairs will lie at consecutive positions along the placement path.

15. A device for use in developing a placement path along which components taken from respective component supplies will be placed on a circuit board, the device comprising elements that are configured to:

identify, for each location at which a component will be placed, the component supply from which the component will be taken;

determine, for at least one selected component supply, which, if any, of the other component supplies are identified with locations lying within a predetermined proximity of a location identified with the selected component supply; and develop the placement path based on the proximity determination.

16. The device of claim 15 wherein the elements also are configured to:

determine, for each component supply, a relative frequency at which locations identified with the component supply lie within a predetermined proximity of locations identified with each of the other component supplies; and develop the placement path based on the relative frequency determinations.

17. The device of claim 16 wherein the elements also are configured to:

identify two component supplies that are associated with a given relative frequency.

18. The device of claim 17 wherein the placement path is developed so that all of the locations with which the two component supplies are identified will lie at consecutive positions along the placement path.

19. The device of claim 18 wherein the elements also are configured to:

identify a third component supply that, in combination with one of the two component supplies, is associated with another given relative frequency.

20. The device of claim 19 wherein the placement path is developed so that all of the locations with which the three component supplies are identified will lie at consecutive positions along the placement path.

21. The device of claim 15 wherein the placement path is developed so that all of the locations with which at least two of the component supplies are identified will lie at consecutive positions along the placement path.

22. The device of claim 15 wherein the placement path is developed so that all of the locations with which three of the component supplies are identified will lie at consecutive positions along the placement path.

23. The device of claim 15 wherein two locations lie within the predetermined proximity only if both locations lie within a given section of the circuit board.

24. A device for use in developing a placement path along which components taken from respective component supplies will be placed on a circuit board having at least two sections, the device comprising elements that are configured to:

identify, for each location at which a component will be placed, the component supply from which the component will be taken;

identify, for each section of the circuit board, which, if any, of the component supplies are identified with one of the locations in the section;

establish, for each possible pair of the component supplies, a count of how many sections, if any, are identified with both of the component supplies in the pair;

identify, from all possible pairs of component supplies, a first pair for which the highest count is established; and develop the placement path so that all of the locations identified with the first pair of component supplies are in a set of locations that will lie at consecutive positions along the placement path.

25. The device of claim 24 wherein none of the sections overlap.

26. The device of claim 24 wherein at least some of the sections overlap.

27. The device of claim 24 wherein the elements also are configured to:

identify, from all other possible pairs of component supplies that include one of the component supplies in the first pair, a second pair of component supplies, wherein the second pair has a highest count of the counts established for the other possible pairs of component supplies that include one of the component supplies in the first pair.

28. The device of claim 27 wherein the placement path is developed so that all locations identified with either the first or the second pair of component supplies will lie at consecutive positions along the placement path.

29. A computer system for use in developing a placement path along which components taken from respective component supplies will be placed on a circuit board, the computer system comprising:

a storage device configured to store information about the components to be placed on the board; and a processor operable to retrieve the information and to use the information to:

identify, for each location at which a component will be placed, the component supply from which the component will be taken;

determine, for at least one selected component supply, which, if any, of the other component supplies are identified with locations lying within a predetermined proximity of a location identified with the selected component supply; and develop the placement path based on the proximity determination.

* * * * *